(12) United States Patent
Scheuerlein

(10) Patent No.: US 8,946,017 B2
(45) Date of Patent: Feb. 3, 2015

(54) METHOD OF MAKING A TFT CHARGE STORAGE MEMORY CELL HAVING HIGH-MOBILITY CORRUGATED CHANNEL

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 243 days.

(21) Appl. No.: 13/351,456

(22) Filed: Jan. 17, 2012

(65) Prior Publication Data

US 2012/0115289 A1 May 10, 2012

Related U.S. Application Data

(62) Division of application No. 11/143,355, filed on Jun. 1, 2005, now Pat. No. 8,110,863.

(51) Int. Cl.

| H01L 31/072 | (2012.01) |
| H01L 29/423 | (2006.01) |
| B82Y 10/00 | (2011.01) |
| H01L 21/84 | (2006.01) |
| H01L 27/115 | (2006.01) |
| H01L 27/12 | (2006.01) |
| H01L 29/66 | (2006.01) |
| H01L 29/78 | (2006.01) |
| H01L 29/788 | (2006.01) |
| H01L 29/792 | (2006.01) |
| G11C 16/04 | (2006.01) |

(Continued)

(52) U.S. Cl.
CPC ........... *H01L 29/42332* (2013.01); *B82Y 10/00* (2013.01); *H01L 21/845* (2013.01); *H01L 27/115* (2013.01); *H01L 27/11568* (2013.01); *H01L 27/11578* (2013.01); *H01L 27/1211* (2013.01); *H01L 29/66833* (2013.01); *H01L 29/785* (2013.01); *H01L 29/7853* (2013.01); *H01L 29/7881* (2013.01); *H01L 29/792* (2013.01); *G11C 16/0475* (2013.01); *H01L 27/0688* (2013.01); *H01L 29/0649* (2013.01); *H01L 29/1037* (2013.01); *H01L 29/7854* (2013.01); *H01L 29/78618* (2013.01)
USPC .......................... 438/201; 438/211; 438/257

(58) Field of Classification Search
CPC .................................................. H01L 21/28282
USPC .................................. 438/257–267, 201, 211
See application file for complete search history.

(56) References Cited

U.S. PATENT DOCUMENTS

| 3,930,300 A | 1/1976 | Nicolay |
| 4,003,126 A | 1/1977 | Holmes et al. |

(Continued)

FOREIGN PATENT DOCUMENTS

WO  WO 2006/130801  12/2006

OTHER PUBLICATIONS

International Search Report and Written Opinion of International Application No. PCT/US2006/021373 mailed Jan. 5, 2007.

(Continued)

*Primary Examiner* — Samuel Gebremariam
(74) *Attorney, Agent, or Firm* — Dugan & Dugan, PC

(57) ABSTRACT

Numerous other aspects are provided a method for making a nonvolatile memory cell. The method includes forming a non-planar dielectric structure, and conformally depositing a semiconductor layer over the dielectric structure. A portion of the semiconductor layer serves as a channel region for a transistor, and the channel region is non-planar in shape.

13 Claims, 8 Drawing Sheets

(51) Int. Cl.
*H01L 27/06* (2006.01)
*H01L 29/06* (2006.01)
*H01L 29/10* (2006.01)
*H01L 29/786* (2006.01)

(56) References Cited

U.S. PATENT DOCUMENTS

| | | |
|---|---|---|
| 5,915,167 A | 6/1999 | Leedy |
| 5,973,358 A | 10/1999 | Kishi |
| 6,018,186 A | 1/2000 | Hsu |
| 6,501,135 B1 | 12/2002 | Krivokapic |
| 6,649,972 B2 | 11/2003 | Eitan |
| 6,713,371 B1 | 3/2004 | Gu |
| 6,800,910 B2 | 10/2004 | Lin et al. |
| 6,807,119 B2 | 10/2004 | Fasoli et al. |
| 6,828,580 B2 | 12/2004 | Zhana |
| 6,849,905 B2 | 2/2005 | Ilkbahar et al. |
| 6,858,502 B2 | 2/2005 | Chu et al. |
| 6,881,994 B2 | 4/2005 | Lee et al. |
| 6,897,533 B1 | 5/2005 | Yang et al. |
| 6,940,125 B2 | 9/2005 | Kianian et al. |
| 6,960,794 B2 | 11/2005 | Walker |
| 7,012,299 B2 | 3/2006 | Mahajani |
| 7,045,851 B2 | 5/2006 | Black et al. |
| 7,195,992 B2 | 3/2007 | Gu |
| 7,432,141 B2 | 10/2008 | Gu |
| 7,505,321 B2 | 3/2009 | Scheuerlein et al. |
| 2002/0028541 A1* | 3/2002 | Lee et al. .................. 438/149 |
| 2003/0057435 A1 | 3/2003 | Walker |
| 2004/0031984 A1 | 2/2004 | Kianian et al. |
| 2004/0256662 A1 | 12/2004 | Black et al. |
| 2005/0023569 A1 | 2/2005 | Yang |
| 2006/0273404 A1 | 12/2006 | Scheuerlein |

OTHER PUBLICATIONS

Kee-Chan Park et al., "A New Poly-Si Thin-Film Transistor with Poly-Si/a-Si Double Active Layer", Oct. 2000, IEEE Electron Device Letters, vol. 21 No. 10, pp. 488-490.

Office Action of European Application No. 06 760 637.6 dated Jul. 1, 2008.
Jan. 12, 2009 Reply to Jul. 1, 2008 Office Action of European Patent Application No. 06 760 637.6.
Office Action of U.S. Appl. No. 11/143,355 mailed Feb. 7, 2008.
Jul. 7, 2008 Reply to Feb. 7, 2008 OA of U.S. Appl. No. 11/143,355.
Final Office Action of U.S. Appl. No. 11/143,355 mailed Oct. 20, 2008.
Jan. 29, 2009 Reply to Oct. 20, 2008 Final Office Action of U.S. Appl. No. 11/143,355.
Office Action of U.S. Appl. No. 11/143,355 mailed Apr. 8, 2009.
Jul. 8, 2009 Reply to Apr. 8, 2009 Office Action of U.S. Appl. No. 11/143,355.
Office Action of China Patent Application No. 200680027101.1 issued Apr. 10, 2009.
Office Action of U.S. Appl. No. 11/143,355 mailed Nov. 12, 2009.
Oct. 9, 2009 Reply to Apr. 10, 2009 Office Action of counterpart Chinese Application No. 200680027101.1.
Feb. 12, 2010 Reply to Nov. 12, 2009 Office Action of U.S. Appl. No. 11/143,355.
Notice of Non-Compliant Amendment of U.S. Appl. No. 11/143,355 mailed May 26, 2010.
Jun. 1, 2010 Reply to Notice of Non-Compliant Amendment of U.S. Appl. No. 11/143,355.
Final Office Action of U.S. Appl. No. 11/143,355 mailed Aug. 16, 2010.
Restriction Requirement of U.S. Appl. No. 11/143,355 mailed Oct. 9, 2007.
Nov. 9, 2007 Reply to Restriction Requirement of U.S. Appl. No. 11/143,355 mailed Oct. 9, 2007.
Notice of Allowance of U.S. Appl. No. 11/143,355 mailed Sep. 7, 2011.
Amendment After Allowance (37 CFR Section 1.312) of U.S. Appl. No. 11/143,355 mailed Sep. 8, 2011.
Nov. 16, 2010 Response to Final Office Action of U.S. Appl. No. 11/143,355 mailed Aug. 16, 2010.

* cited by examiner

Program

Read

Erase

US 8,946,017 B2

METHOD OF MAKING A TFT CHARGE STORAGE MEMORY CELL HAVING HIGH-MOBILITY CORRUGATED CHANNEL

REFERENCE TO RELATED APPLICATIONS

This application is a division of U.S. patent application Ser. No. 11/143,355, filed Jun. 1, 2005, now U.S. Pat. No. 8,110,863, which is incorporated by reference herein in its entirety for all purposes.

BACKGROUND

The invention relates to a memory cell that operates by storing charge; in preferred embodiments, two bits are stored per cell, the cell programmed by a channel hot electron injection method.

As will be described, using a channel hot electron injection method, charge can selectively be stored in neither, either, or both of two distinct charge storage regions in a transistor-based memory cell, increasing device density by storing two bits per cell. As the cell is formed at smaller feature size, however, it becomes increasingly difficult to keep the two storage regions distinct.

There is a need, therefore, for a high-density charge storage memory cell in which two separate charge storage regions are kept distinct without increasing the area of the cell.

SUMMARY

The present invention is defined by the following claims, and nothing in this section should be taken as a limitation on those claims. In general, the invention is directed to a non-volatile charge-storage memory cell programmed by a channel hot electron injection method.

A first aspect of the invention provides for a field effect transistor comprising: a channel region having a length; a source region abutting the channel region at a source/channel boundary; and a drain region abutting the channel region at a drain/channel boundary; wherein the length of the channel region is greater than a first distance between the source/channel boundary and the drain/channel boundary, wherein the channel region is formed above a substrate.

Another aspect of the invention provides for a method for making a nonvolatile memory cell, the method comprising: forming a non-planar dielectric structure; and conformally depositing a semiconductor layer over the dielectric structure, wherein a portion of the semiconductor layer serves as a channel region for a transistor, and wherein the channel region is non-planar in shape.

Yet another aspect of the invention provides for a method for making a nonvolatile memory cell, the method comprising: forming a non-planar dielectric structure; and conformally depositing a semiconductor layer over the dielectric structure, wherein a portion of the semiconductor layer serves as a channel region for a transistor, a portion of the semiconductor layer serves as a source region for the transistor, a portion of the semiconductor layer serves as a drain region for the transistor, and wherein the channel region does not have a substantially planar shape and a portion of the channel region is disposed above the source region and the drain region.

A preferred embodiment of the present invention provides for a monolithic three dimensional memory array comprising: a) a first memory level formed above a substrate, the first memory level comprising a first plurality of field effect transistors, each first field effect transistor comprising: i) a channel region having a first length; ii) a source/drain region abutting the channel region at a source/drain/channel boundary; and iii) a drain/source region abutting the channel region at a drain/source/channel boundary, the drain/source/channel boundary at a first distance from the source/drain/channel boundary, wherein the first length is greater than the first distance; and b) at least a second memory level monolithically formed above the first memory level.

A related embodiment provides for a method for forming a monolithic three dimensional memory array, the method comprising: forming a first plurality of substantially parallel, substantially coplanar rail-shaped dielectric features extending in a first direction; conformally depositing a first semiconductor layer over the first rail-shaped dielectric features; conformally forming a first charge storage stack over the first semiconductor layer; forming a first plurality of substantially parallel, substantially coplanar word lines over the first charge storage dielectric, the wordlines extending in a second direction different from the first direction.

An aspect of the invention provides for a thin film transistor comprising a channel region, wherein the channel region comprises a deposited polycrystalline germanium layer.

Yet another aspect of the invention provides for a field effect transistor comprising: a channel region; a source region; and a drain region, wherein the source region and the drain region are substantially coplanar in a substantially horizontal plane, and wherein the channel region is not coplanar with the source region and the drain region, and is not in a substantially horizontal plane, and wherein the channel region comprises polycrystalline semiconductor material.

Each of the aspects and embodiments of the invention described herein can be used alone or in combination with one another.

The preferred aspects and embodiments will now be described with reference to the attached drawings.

BRIEF DESCRIPTION OF THE DRAWINGS

Features of the present invention can be more clearly understood from the following detailed description considered in conjunction with the following drawings, in which the same reference numerals denote the same elements throughout, and in which:

FIG. 2b is a cross-sectional view showing the same memory array viewed at ninety degrees to the view of FIG. 2a;

DETAILED DESCRIPTION

Figure 1A:
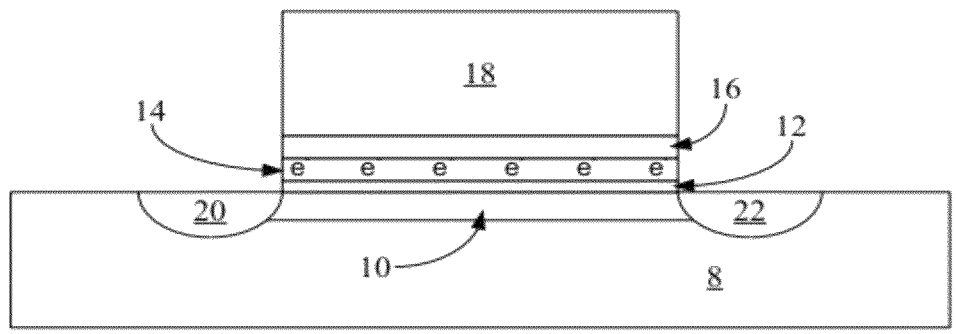
FIG. 1a is a cross-sectional view of a prior art SONGS memory cell programmed by Fowler-Nordheim tunneling.

FIG. 1a shows a conventional SONGS memory cell. A SONGS memory cell is a field effect transistor having a charge storage region. Channel region 10 is formed of lightly doped P-type silicon, for example formed by ion implantation in a monocrystalline wafer substrate 8. Tunneling oxide layer 12, charge storage nitride layer 14, and blocking oxide layer 16 are formed on channel region 10. A gate electrode 18, for example of heavily doped polycrystalline silicon (which will be referred to in this discussion as polysilicon), is formed above blocking oxide layer 16. Gate electrode 18 may be doped by in-situ doping (in which dopant atoms are flowed while the polysilicon of gate electrode 18 is being deposited and are incorporated into the silicon) or doped after deposition, for example by ion implantation. Heavily doped n-type source region 20 and drain region 22 are formed in substrate 8 by ion implantation. The conventional silicon-oxide-nitride-oxide-silicon stack gives the SONGS cell its name, though other materials may be used for any of these layers.

The cell of FIG. 1a can be programmed by a Fowler-Nordheim tunneling mechanism. To program this cell, a high voltage is applied to gate electrode 18, forming a conductive channel in channel region 10. A low voltage is applied at source region 20 and/or at drain end 22. Electrons (indicated by "e-" in FIG. 1a), attracted by the high voltage of gate electrode 18, tunnel through tunneling oxide layer 12 and are trapped in charge storage nitride layer 14. When the voltage is removed from gate electrode 18, electrons remain trapped in charge storage nitride layer 14, their escape blocked by tunneling oxide layer 12 and blocking oxide layer 16. The threshold voltage (the voltage that must be applied to gate electrode 18 to form a conductive channel, turning the cell "on") is different for a cell with charge stored in charge storage nitride layer 14 than one with no stored charge. In this way a SONGS cell can behave as a memory cell; a programmed cell with stored charge can be considered a data "0" while an unprogrammed cell with no stored charge can be considered a data "1", or vice versa. The programmed cell and the unprogrammed cell are distinguished by their different threshold voltages. This nonvolatile cell can be read, erased, and rewritten many times.

To increase device density, it is desirable to store two bits per cell. In a cell that operates by storing charge, one way to do this is to store charge in two distinct regions.

An alternative method of programming is known as channel hot electron ("CHE") injection. In this method of programming, source voltage is low, gate voltage is above the threshold voltage, and drain voltage is higher than the gate voltage. The cell is in saturation, at which point additional increases in source-drain voltage will cause no significant increase in current through the transistor.

Figure 1B:
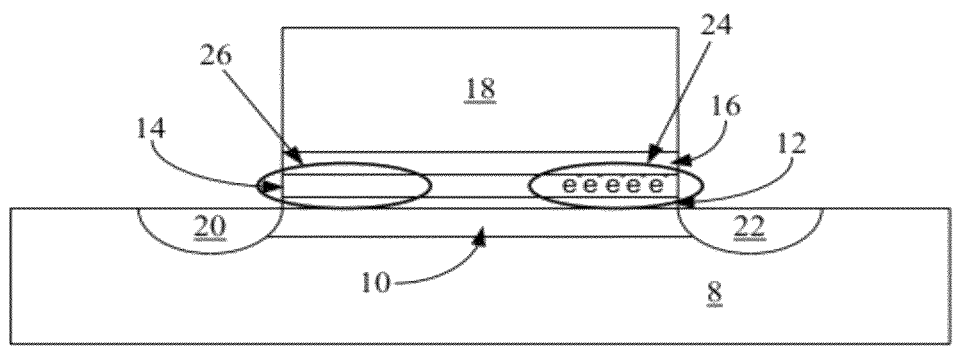
FIG. 1b is a cross-sectional view of a prior art SONGS memory cell programmed by CHE injection.

For example, turning to FIG. 1b, suppose source region 20 is set to ground (0 volts), gate electrode 18 is at 2.5 volts, drain region 22 is at 4 volts, and that the transistor has a threshold voltage of 1 volt. At the source end of the channel region, the gate-to-source voltage is 2.5 volts, well above the threshold voltage, and a conductive channel is formed. Because of the high drain voltage, however, voltage in the channel increases across the channel from the source end to the drain end; thus the voltage between the gate and the channel decreases. At the drain end, very close to drain region 22, no conductive channel actually exists, because the difference between the voltage at the drain end and the gate electrode 18 is below the threshold voltage. But due to the high voltage between source 20 and drain 22, high-energy electrons are injected from the channel to the drain. These high-velocity electrons tend to scatter, and some will be trapped in charge storage nitride layer 14, in charge storage region 24.

In contrast to a SONOS memory cell programmed by Fowler-Nordheim programming, when a SONOS cell is programmed by CHE injection, the charge is stored in only one end of the channel, in this example in charge storage region 24 at the drain end of the cell. Charge can also be stored at the other end of the channel, in a separate charge storage region 26. Because nitride layer 14 is a dielectric, charge will not migrate between regions 24 and 26.

As the cell of FIG. 1b is formed at increasingly small dimensions, however, the two charge storage regions tend to overlap and become difficult to distinguish. CHE injection by its nature is high-energy and difficult to control.

Monolithic three dimensional memory arrays have been formed in which multiple memory levels are stacked atop one another over a single substrate, normally a monocrystalline silicon wafer. Examples are Lee et al. U.S. Pat. No. 6,881,994, "Monolithic three dimensional array of charge storage devices containing a planarized surface," and Scheuerlein et al. U.S. patent application Ser. No. 10/335,078, "Programmable memory array structure incorporating series-connected transistor strings and methods for fabrication and operation of same," filed Dec. 31, 2002, both owned by the assignee of the present invention and hereby incorporated by reference.

In such devices, the channel region in each memory level is conventionally formed of polysilicon. Due to the presence of grain boundaries in polysilicon charge carriers have lower mobility in a polysilicon channel than in a channel formed in monocrystalline silicon. As noted, CHE injection requires electrons to reach high velocity. It has proven difficult to achieve CHE injection in polysilicon channel devices.

In preferred embodiments of the present invention, two storage regions in a single cell are isolated from each other by increasing channel length without increasing the area of the cell by forming a novel corrugated channel region. In preferred embodiments, the channel region is formed of germanium or a silicon-germanium alloy. Germanium has higher carrier mobility than silicon, and the carrier mobility of silicon-germanium alloys increases with germanium content. The higher carrier mobility makes CHE injection easier to achieve. (For simplicity, this discussion has described injection of hot electrons. With polarities reversed and complementary doping type semiconductor material, holes can be injected instead. It will be understood by those skilled in the art that the present invention can be practiced using hole injection rather than electron injection.).

Figure 2A:
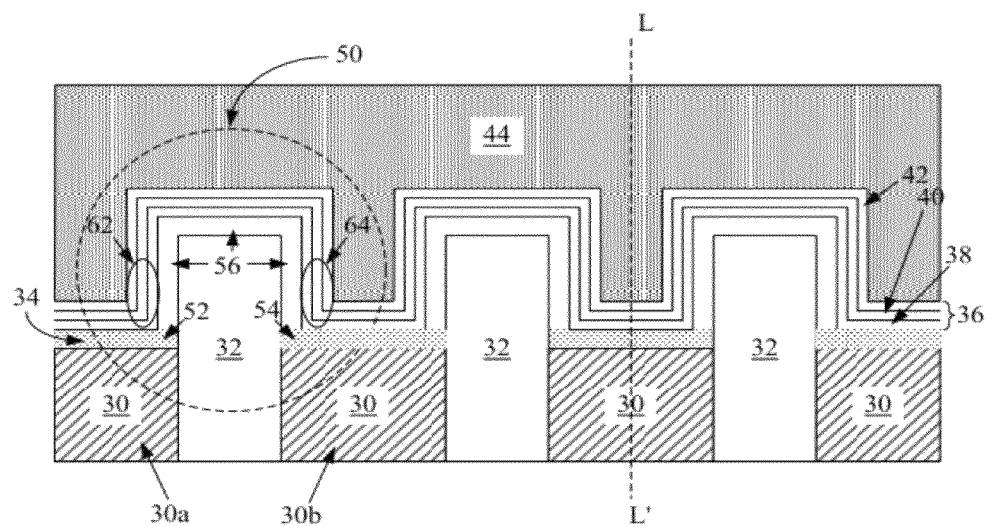
FIG. 2a is a cross-sectional view a portion of an array of memory cells formed according to an embodiment of the present invention.

A memory cell formed according to a preferred embodiment of the present invention is shown in FIG. 2a. Substantially parallel, substantially coplanar bit lines 30, extending out of the page, are shown in cross-section. Dielectric structures 32 are formed between bit lines 30, and bit lines 30 are recessed relative to dielectric structures 32.

Channel layer 34, preferably of germanium or a silicon-germanium alloy, is conformally deposited on bit lines 30 and dielectric structures 32, giving it a corrugated shape. Charge storage stack 36 is formed on channel layer 34. In some embodiments, charge storage stack 36 consists of dielectric layers 38, 40, and 42. Dielectric layer 38 is adapted to prevent stored charge from escaping to the channel layer. It is in contact with the channel layer and will be called the channel blocking dielectric. Channel blocking dielectric 38 is typically formed of silicon dioxide. Dielectric layer 40 is adapted to store charge, will be called the charge storage dielectric, and is conventionally formed of silicon nitride. Dielectric layer 42 is adapted to prevent stored charge from escaping to the gate electrode, and will be called the gate blocking dielectric. Gate blocking dielectric 42 is conventionally formed of silicon dioxide. In an alternative embodiment, charge storage dielectric 40 can be replaced with electrically isolated nanocrystals. Nanocrystals are small clusters of atoms or crystals of a conductor or semi-conductor material that are electrically isolated from one another.

Figure 2B:
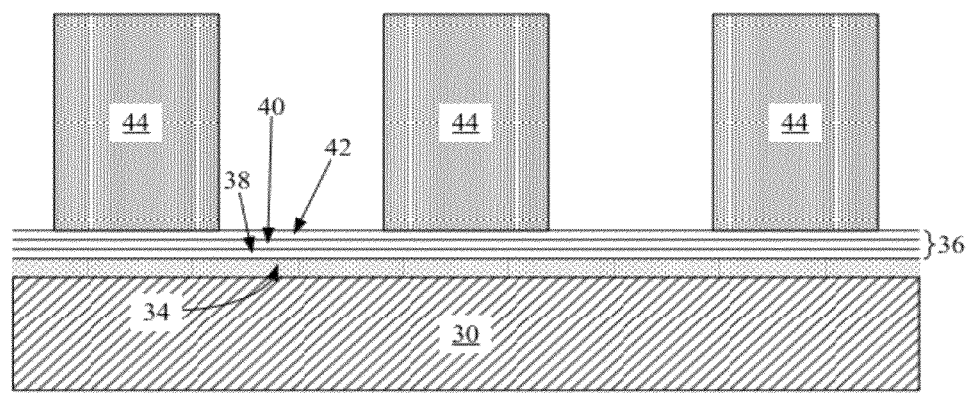

Substantially parallel wordlines 44 extend in a different direction from bitlines 30, preferably perpendicular to them. FIG. 2b shows the same structure viewed at ninety degrees along line L-L'.

Referring to FIG. 2a, a field effect transistor 50 is formed, for example, having source region 52, drain region 54, and channel region 56, which has an inverted-U shape. The transistor 50 is accessed through source line 30a, drain line 30b, and word line 44. Field effect transistor 50 operates as a NOR memory cell. It will be seen that channel region 56 is significantly longer than the distance between source region 52 and drain region 54. In general, source region 52 and drain region 54 are substantially coplanar in a substantially horizontal plane, while channel region 56 is not coplanar with source region 52 and the drain region 54, and is not in a substantially horizontal plane.

The increased channel length and its shape allow two charge storage regions 62 and 64 to be more effectively isolated than if channel region 56 had a conventional planar shape. This cell is adapted to store two bits. Thus increased channel length and isolation of charge storage regions is achieved without increasing the area of the transistor, and thus of the memory cell.

A first memory level is shown in FIG. 2a. Additional memory levels can be formed above this memory level, all over a single substrate, forming a very dense monolithic three dimensional memory array having multiple stacked memory levels.

A detailed example will be provided describing fabrication of a monolithic three dimensional memory array formed according to a preferred embodiment of the present invention. For completeness, many details of fabrication will be provided. It will be understood by those skilled in the art that this example is intended to be non-limiting, and many details provided here can be modified, augmented, or omitted while the results fall within the scope of the invention.

Some fabrication details from Lee et al. and Scheuerlein et al. may be relevant to forming the monolithic three dimensional memory array of the example. For clarity, not all details from Lee et al. and Scheuerlein et al. have been included, but it will be understood that no teaching from those or other incorporated patents and applications is intended to be excluded.

EXAMPLE

Figure 3A:
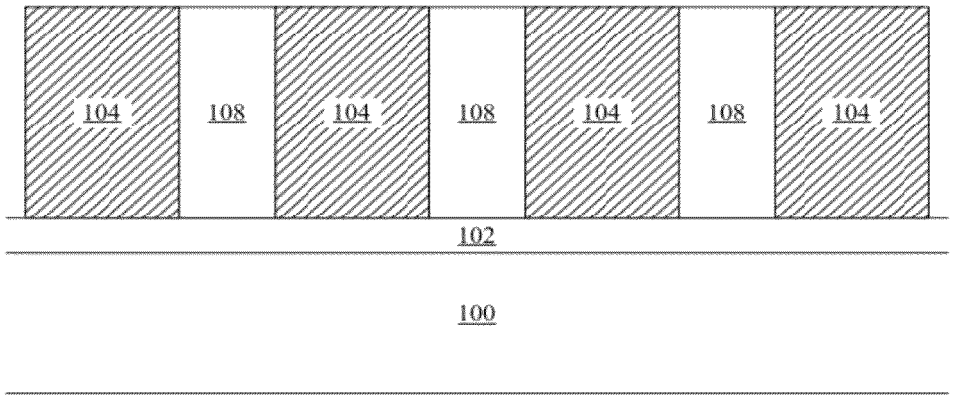
FIGS. 3a-3g are cross-sectional views showing different stages in formation of a memory level of memory cells formed according to an embodiment of the present invention.

Turning to FIG. 3a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

Generally electrical connections will need to be made between the bit lines about to be formed and conductive layers formed in the substrate 100. Voids (not shown) can be etched at this stage in insulating layer 102. Vertical interconnects will later be formed in these voids.

Referring to FIG. 3a, a conductive layer 104, preferably heavily doped n-type silicon, is deposited. (For simplicity, this example will describe fabrication of NMOS transistors. Clearly if desired PMOS devices could be formed instead.) This layer will ultimately form bit lines. As will be described, layer 104 will be subjected to a planarizing process and a recess etch. The thickness of conductive layer 104, then, should be the desired bit line thickness plus the thickness that will be lost in the planarization and etch steps. For example, layer 104 may be between about 3000 angstroms and about 9000 angstroms thick, preferably between about 5000 angstroms and about 7000 angstroms thick. Silicon layer 104 is preferably doped in situ, but may be doped by ion implantation instead. When deposited using conventional deposition techniques, silicon layer 104 will be amorphous as deposited and will be crystallized to polysilicon by subsequent thermal processing or by a later anneal. In some embodiments the conductive layer 104 comprises a silicon germanium alloy or germanium.

Silicon layer 104 also fills the voids previously etched in dielectric layer 102, forming vertical interconnects (not shown) to a buried routing layer.

Still referring to FIG. 3a, silicon layer 104 is patterned and etched to form substantially parallel, substantially coplanar bit lines 104 shown in cross-section extending out of the page. Dielectric material 108 is deposited over and between bit lines 104, covering them and filling gaps between them. Dielectric material 108 can be any appropriate material, preferably silicon dioxide deposited by a chemical vapor deposition ("CVD") method, preferably by high density plasma CVD ("HDPCVD").

Next the overfill of dielectric material 108 is removed by a planarization method, for example by chemical mechanical polishing ("CMP") or etchback, to expose tops of bitlines 104 and form a substantially planar surface. To summarize, the planar surface was formed by depositing a first conductive material; patterning and etching the first conductive material to form first conductive rails; depositing the first dielectric material over and between the first conductive rails; and planarizing to expose tops of the first conductive rails. Alternatively, this structure could have been formed by a damascene method.

Figure 3B:
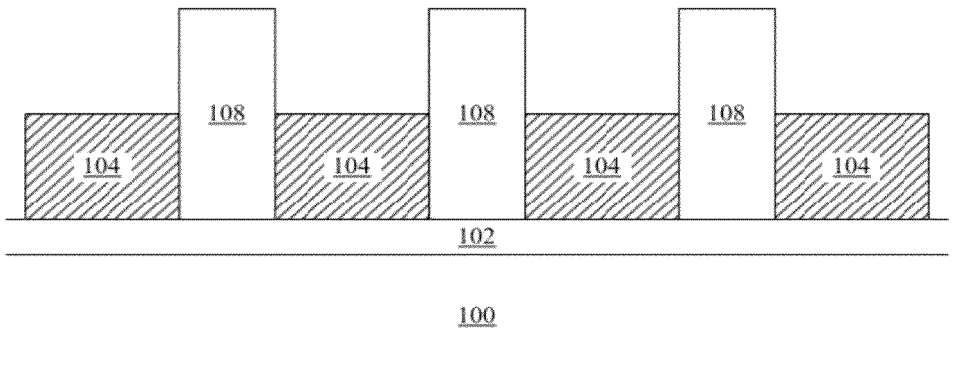

Turning to FIG. 3b, a selective etch is performed, etching silicon bitlines 104. The etch is continued until silicon bitlines 104 are substantially recessed relative to dielectric structures 108. This etch is stopped when a desired thickness of silicon bitlines 104 has been removed. In a preferred embodiment, after the recess etch, the remaining thickness of silicon bitlines 104 is between about 1000 and about 4000 angstroms. It will be seen that the resulting surface is corrugated.

The amount of recess can be as desired. For example, the amount of recess can be about 1000 to about 4000 angstroms, preferably about 2000 to about 3000 angstroms. Depending on the width of dielectric structures 108, the length of the channel region to be formed can be between about 3000 and about 9000 angstroms.

Figure 3C:
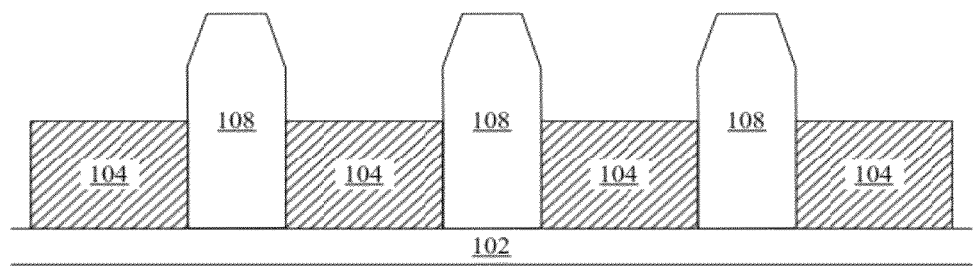
Figure 3D:
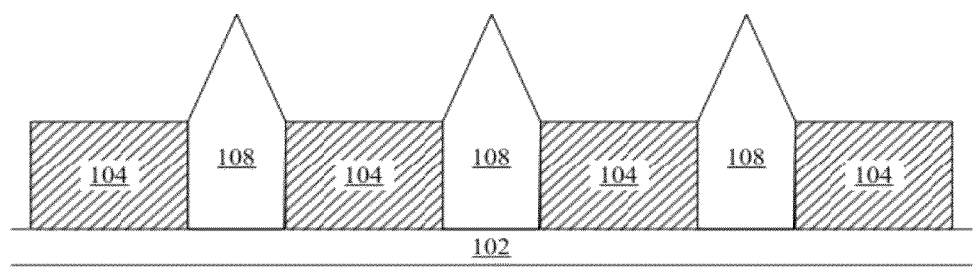
Figure 3E:
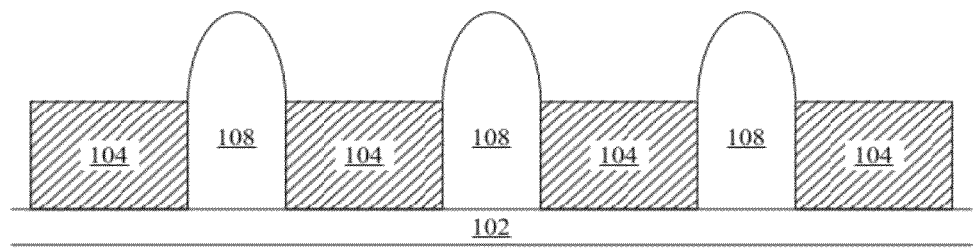

Depending on the etchants selected and the degree of selectivity and isotropy of the etch, the dielectric material 108 may be etched to some degree. FIG. 3b illustrates dielectric structures 108 as they would appear with no lateral etching. FIGS. 3c, 3d, and 3e illustrate alternative shapes that dielectric structures 108 may have after the recess etch is complete. (To save space, in FIGS. 3c, 3d, and 3e, substrate 100 has been omitted. Its presence in this and subsequent figures should be assumed.). Other shapes can be imagined, so long as after the recess etch the surface of the structure is non-planar, i.e., not coplanar with adjacent bit lines 104. Preferably the bitlines 104 are recessed relative to the dielectric structures 108, but this topography may be reversed if desired.

To summarize, in this embodiment, rail-shaped dielectric features have been formed by forming a substantially planar surface coexposing alternating stripes of first dielectric material and first conductive material; and etching to recess the first conductive material, leaving the rail-shaped dielectric features. The rail-shaped dielectric features may have sloping sidewalls.

Figure 3F:
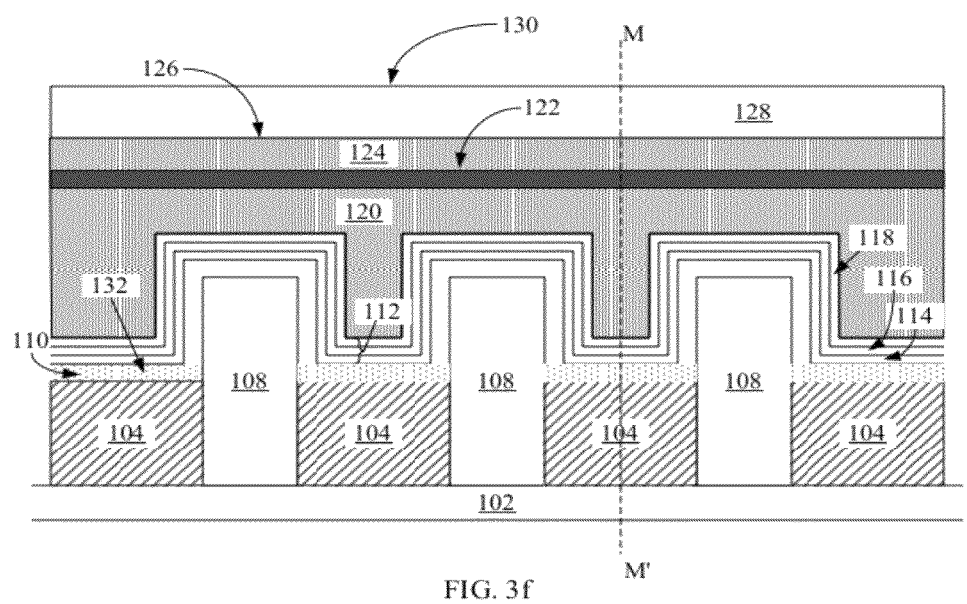

Turning to FIG. 3f, next a channel layer 110 is deposited over the corrugated surface. This channel layer 110 is a semiconductor material, and may be germanium, a silicon-germanium alloy, or silicon. Layer 110 is preferably germanium. In the present example, germanium layer 110 is preferably lightly doped with p-type dopants.

This layer can be formed by any conventional method. Methods for increasing grain size of a deposited semiconductor film, thus increasing carrier mobility of the channel, are described in Gu U.S. Pat. No. 6,713,371, "Large Grain Size Polysilicon Films Formed by Nuclei-Induced Solid Phase Crystallization," Gu et al. U.S. patent application Ser. No. 10/681,509, "Uniform Seeding to Control Grain and Defect Density of Crystallized Silicon for Use in Sub-Micron Thin Film Transistors," filed Oct. 7, 2003, and Gu et al. U.S. patent application Ser. No. 10/936,168, "Large-Grain P-Doped Polysilicon Films for Use in Thin Film Transistors," filed Sep. 8, 2004, all owned by the assignee of the present invention and all herein incorporated by reference. A method to limit variability of threshold voltages among an array of thin film transistors is described in Walker et al. U.S. patent application Ser. No. 10/334,649, "Formation of Thin Channels for TFT Devices to Ensure Low Variability of Threshold Voltages," filed Dec. 31, 2002, owned by the assignee of the present invention and hereby incorporated by reference. Any of these techniques may be useful in the deposition and crystallization of channel layer 110. It is known to optimize deposition and crystallization conditions (decreasing temperatures and increasing anneal time, for example) to enhance grain size; any conventional techniques may be used, as will be well-known to those skilled in the art. In preferred embodiments, channel layer 110 is amorphous as deposited and is later crystallized to form a polycrystalline semiconductor layer.

Next a charge storage stack 112 is deposited. In preferred embodiments, charge storage stack 112 has three layers: channel blocking dielectric 114, charge storage dielectric 116, and gate blocking dielectric 118. Channel blocking dielectric 114 is any appropriate dielectric, for example an oxide layer, preferably silicon dioxide. It can be any appropriate thickness, for example between about 10 and about 100 angstroms thick, preferably between about 30 and about 60 angstroms thick. Charge storage dielectric 116 is conventionally silicon nitride, which can be any appropriate thickness, preferably between about 20 and about 200 angstroms. Mahajani et al. U.S. patent application Ser. No. 10/668,693, "Storage Layer Optimization of a Non Volatile Memory Device," filed Sep. 23, 2003, owned by the assignee of the present invention and hereby incorporated by reference, describes multi-layer charge storage dielectric regions optimized to improve charge retention; these techniques may be used in preferred embodiments of the present invention. In alternative embodiments, charge storage dielectric 116 may be replaced by conductive nanocrystals. Gate blocking dielectric 118 is any appropriate dielectric, for example an oxide layer, preferably silicon dioxide. It can be any appropriate thickness, for example between about 10 and about 150 angstroms thick, preferably between about 30 and about 60 angstroms thick.

Wordlines will be formed next. Electrical connections may be made between the wordlines about to be formed and conductors on lower levels. A pattern and etch step may be performed at this point to open voids (not shown) in which vertical interconnects will be formed. Alternatively, these vertical voids could be formed following formation of word lines; in this case the voids would extend to contact both portions of the word line and portions of lower conductors. The voids would be filled later, during formation of top conductors (as will be described later), forming connections between multiple layers. A contact structure like that illustrated in FIG. 27 of the Scheuerlein patent earlier incorporated may be advantageously used to contact the bit lines of the present invention.

Next conductive layer 120 is deposited over charge storage stack 112. Conductive layer 120 is any appropriate conductive material. In a preferred embodiment, conductive layer 120 is silicon heavily doped with n-type dopants. When deposited using conventional methods, N+ silicon layer 120 will be amorphous, and will become polycrystalline following subsequent thermal processing or an anneal step. N+ silicon layer 120 will fill any voids in dielectric material 108, forming vertical interconnects (not shown). In some embodiments the conductive layer 120 comprises a silicon germanium alloy or pure germanium.

In a preferred embodiment, a thin layer of titanium (not shown) is deposited on N+ silicon layer 120, followed by a thin layer of titanium nitride (not shown). An additional layer 124 of more conductive material, preferably N+ silicon, is deposited on the titanium/titanium nitride stack. The titanium and titanium nitride will react with the surrounding silicon to form titanium silicide layer 122, which will improve conductivity of the word lines to be formed.

Figure 3G:
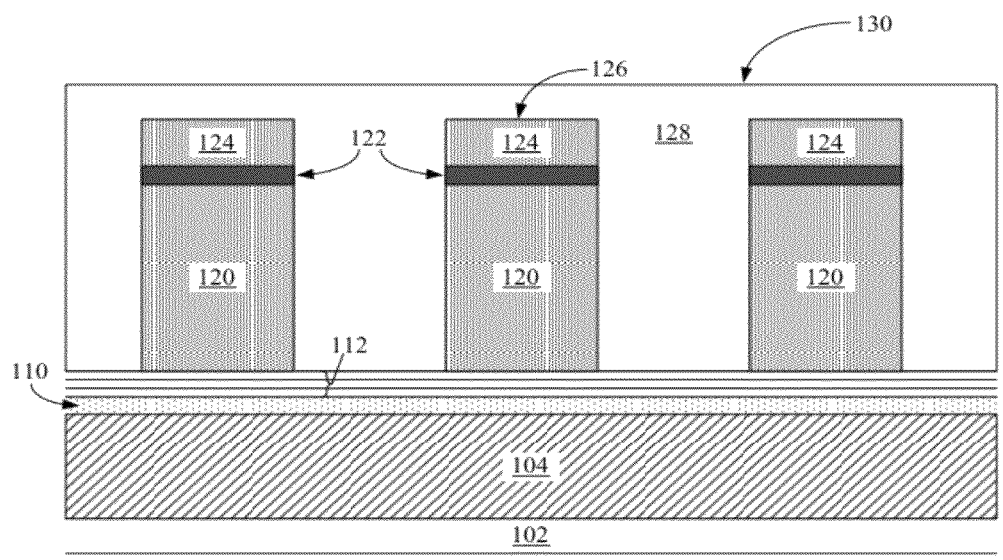

Layers 120, 122, and 124 are patterned and etched to form substantially parallel word lines 126, preferably extending substantially perpendicular to bit lines 104. The dielectric layers of charge storage stack 112 can serve as an etch stop. FIG. 3g shows the structure after the word line etch, seen at ninety degrees to the view of FIG. 3f, along line M-M'. The etch must fully isolate adjacent word lines 126, but need not etch through charge storage stack 112 or channel layer 110.

In alternative embodiments, additional p-type dopant atoms are implanted by ion implantation in portions of channel layer 110 exposed between the word lines 126 just formed, using etched word lines 126 as a mask during the implant step, reducing leakage. Optionally an etch step may be preformed to remove portions of charge storage stack 112 and channel layer 110 exposed between the word lines 126.

Referring to FIGS. 3f and 3g, dielectric material 128, for example oxide deposited by an HDPCVD method, is deposited over and between word lines 126, covering them. A substantially planar surface 130 is formed on dielectric 128. This surface 130 can be formed by overfilling until the HDP dielectric tends to self-planarize, then etching back if desired, or by CMP.

A first memory level, shown in FIGS. 3f and 3g, has been completed. Additional memory levels can be formed above this first memory level, with fabrication of the next memory level beginning with formation of second bit lines on substantially planar surface 130, using the same methods described earlier.

A final anneal may be required to crystallize the silicon of bit lines 104 and of layers 120 and 124 of word lines 126, and the germanium of channel layer 110. This or another high-temperature step will also cause dopant to diffuse from bit lines 104 into channel layer 110, forming source and drain regions 132.

In each memory cell, the channel region (the lightly p-doped segment of channel layer 110) meets doped source and drain regions 132 at a source/channel boundary and a drain channel boundary, respectively. What has been described is a field effect transistor comprising a channel region having a length; a source region abutting the channel region at a source/channel boundary; and a drain region abutting the channel region at a drain/channel boundary; wherein the length of the channel region is greater than a first distance between the source/channel boundary and the drain/channel boundary. The channel region is not substantially planar in shape, unlike a conventional channel region.

The memory cell is formed by a method comprising forming a non-planar dielectric structure; and conformally depositing a semiconductor layer over the dielectric structure, wherein a portion of the semiconductor layer serves as a channel region for a transistor, and wherein the channel region is non-planar in shape. A portion of the semiconductor layer serves as a source region for the transistor, and a portion of the semiconductor layer serves as a drain region for the transistor. A portion of the channel region is disposed above the source region and the drain region.

A "dielectric structure" is a structure having a dielectric surface. The dielectric structure has a width. In preferred embodiments the length of the channel region is at least 25 percent more than the width of the non-planar dielectric structure. In more preferred embodiments the length of the channel region is at least twice the width of the non-planar dielectric structure.

These cells can be formed in a monolithic three dimensional memory array comprising: a) a first memory level formed above a substrate, the first memory level comprising a first plurality of field effect transistors, each first field effect transistor comprising: i) a channel region having a first length; ii) a source/drain region abutting the channel region at a source/drain/channel boundary; and iii) a drain/source region abutting the channel region at a drain/source/channel boundary, the drain/source/channel boundary at a first distance from the source/drain/channel boundary, wherein the first length is greater than the first distance; and b) at least a second memory level monolithically formed above the first memory level.

Each memory level comprises a first plurality of substantially parallel, substantially coplanar bit lines extending in a first direction, wherein the source/drain region of each first transistor is in contact with one of the first plurality of bit lines and the drain/source region of each first transistor is in contact with another one of the first plurality of bit lines. Each memory level also comprises a first plurality of word lines extending in a second direction, wherein a portion of one of the first wordlines serves as a gate electrode for each of the first transistors, and wherein the second direction is different from the first direction.

The monolithic three dimensional memory array is formed by a method comprising forming a first plurality of substantially parallel, substantially coplanar rail-shaped dielectric features extending in a first direction; conformally depositing a first semiconductor layer over the first rail-shaped dielectric features; conformally forming a first charge storage stack over the first semiconductor layer; forming a first plurality of substantially parallel, substantially coplanar word lines over the first charge storage dielectric, the wordlines extending in a second direction different from the first direction.

Figure 4:
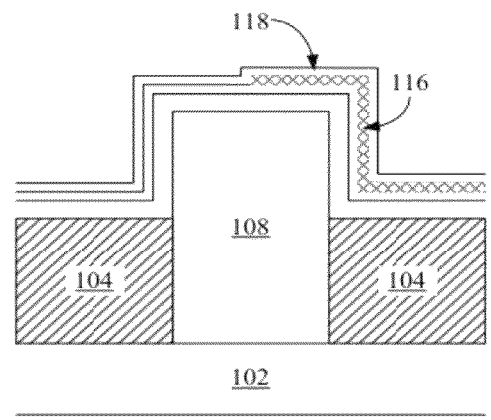
FIG. 4 is a cross-sectional view of a memory cell according to an alternative embodiment of the present invention.

Many alternatives to the structures shown here that fall within the scope of the invention can be imagined. As the memory array described herein is formed at smaller dimensions, for example, it may become more difficult to distinguish between the two charge storage regions of a cell. In one preferred embodiment, shown in FIG. 4, an etch step is performed after the deposition of charge storage dielectric layer 116 (conventionally silicon nitride, cross-hatched for clarity) to selectively remove this layer from one side of the memory cell before the gate blocking dielectric 118 is deposited. The resulting memory cell stores only one bit per cell, rather than two bits per cell as in other preferred embodiments, but the storage regions of adjacent cells are more reliably distinguished, which may be preferable at certain dimensions. Some degree of misalignment in this patterning step can be tolerated. A related technique is described in Ilkbahar et al. U.S. Pat. No. 6,849,905, "Semiconductor Device with Localized Charge Storage Dielectric and Method of Making Same," owned by the assignee of the present invention and hereby incorporated by reference.

Figure 9:
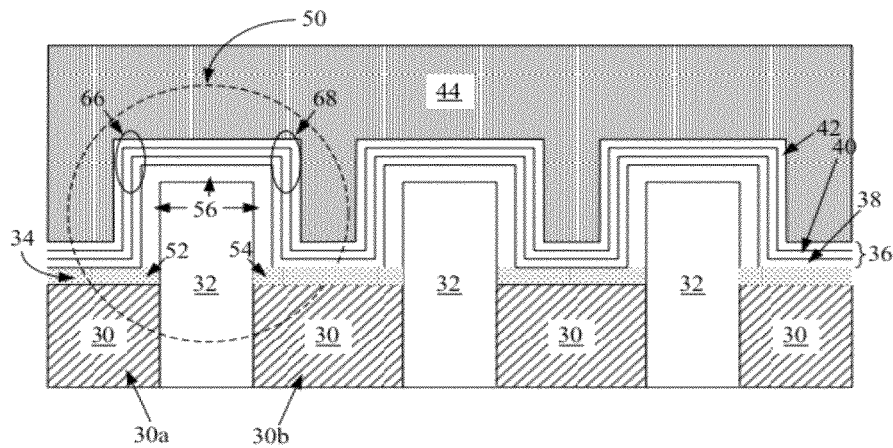
FIG. 9 is a is a cross-sectional view a portion of an array of memory cells formed according to the embodiment of the present invention pictured in FIG. 2a, programmed by a different programming method.

Many other variations are possible. Referring to FIG. 2a, it was explained that in a preferred embodiment charge can be stored in separate charge storage regions 62 and 64 by a CHE injection method. In some embodiments, this cell may be adapted to store only one bit. In an alternative embodiment, for example, turning to FIG. 9 (in which the same elements are identified by the same reference number as in FIG. 2a), such a cell can be programmed by a tunneling method rather than by the CHE method described. If a tunneling method is used, channel blocking dielectric layer 38, charge storage layer 40, and gate blocking dielectric 42 are preferably optimized for this programming method, in ways that are well known to those skilled in the art.

If charge is introduced into charge storage layer 40 by tunneling, the charge may not be localized in regions 62 and 64 as in FIG. 2a, (as when a CHE method is used.) Charge may preferentially be stored at the two corner regions 66 and 68 of the channel 56. The increased length of U-shaped channel 56 reduces leakage currents in device 50.

In some embodiments, potential cell locations along word line 44 could be left unused, leaving a dummy device. Array structures formed with such dummy devices, and the advantageous of same, are described in more detail in Fasoli et al. U.S. Pat. No. 6,807,119, "Array Containing Charge Storage and Dummy Transistors and Method of Operating the Array," owned by the assignee of the present invention and hereby incorporated by reference as though in its entirety. In still other embodiments, portions of the channel are removed by processing so that some bit lines have fewer devices adjacent to them, for example half the devices.

Figure 5:
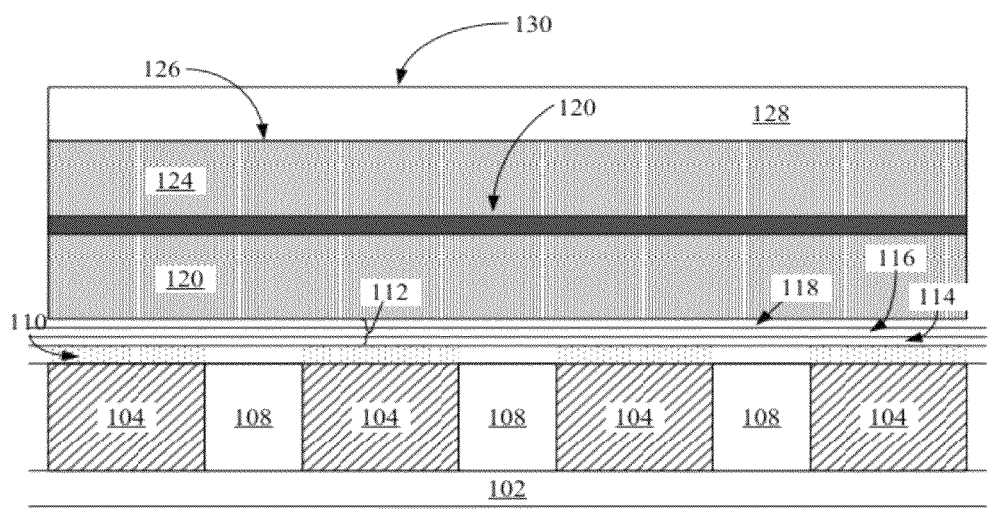
FIG. 5 is a cross-sectional view of a memory cell according to an alternative embodiment of the present invention.

In other embodiments, for example at larger dimensions, the extra isolation between the two storage regions in a cell afforded by the non-planar shape of the channel layer may not be necessary. FIG. 5 shows a memory level formed by the methods described earlier, with the exception that no recess etch is performed to recess bit lines 104 relative to dielectric structures 108, and the channel layer 110 is substantially planar. As described earlier, use of germanium or silicon-germanium, which will be polycrystalline after anneal, in channel layer 110 increases carrier mobility, enabling programming by CHE injection. Multiple memory levels having this structure can be vertically stacked above a single substrate using the methods described herein.

Program, Read, and Erase

Figure 6:
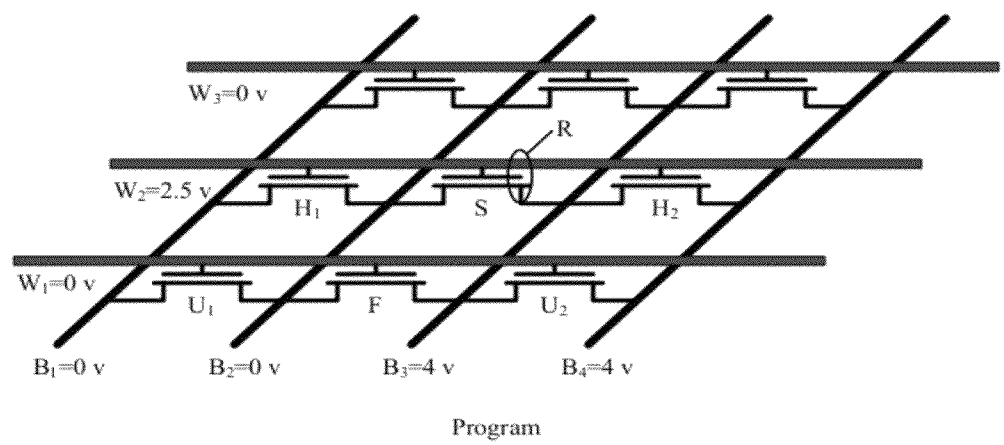
FIG. 6 is a circuit diagram illustrating programming of a selected cell according to a preferred embodiment of the present invention.

Programming of a cell formed according to the present invention is preferably by CHE injection, as described earlier. Turning to FIG. 6, bit lines B1, B2, B3, and B4 correspond to bit lines 104 in FIGS. 3f and 3g, while word lines W1, W2, and W3 of FIG. 6 correspond to word lines 126 in FIGS. 3f and 3g. Cell S is the cell to be programmed.

Selected bit line B2, the source line of selected cell S, is set at a low voltage, for example 0 volts. (For clarity, voltages will be provided in this discussion. It will be understood, however, that, depending on materials selected, dimensions of the memory cells, layer thicknesses, dopant levels, and many other factors, different voltages may be preferred.) Suppose the threshold voltage of cell S is 1 volt. The gate voltage on selected word line W2 is set above the threshold voltage, for example at 2.5 volts. To induce a CHE injection programming method, drain voltage (on bit line B3) is set higher than gate voltage, for example at 4 volts. As described earlier, charge will be stored in charge storage region R at the drain end of cell S.

The other cells in the array should not be programmed during programming of cell S. No voltage (0 volts) is applied to unselected word lines W1 and W3 (and every other unselected word line in the array); thus half-selected cell F, which shares source-side bit line B2 and drain-side bit line B3 with selected cell S, is not turned on.

All of the cells that shares word line W2 with selected cell S have gate voltages above threshold voltage and thus are turned on. To avoid programming of these cells, bit line voltage is set so there is no current in the channel. For example, to avoid programming of cell H1, bit line B1 is set to 0 volts. There is no voltage between its source and drain regions, so no current flows and the cell is not programmed.

Similarly, to prevent inadvertent programming of half selected cell H2, bit line B4 is set at 4 volts. With no voltage drop between bit lines B3 and B4, no current flows through cell H2. Unselected cells U1 and U2, which share neither bit lines nor word lines with selected cell S, have a gate voltage of 0 and no voltage drop between bit lines, and thus will not be programmed.

Figure 7:
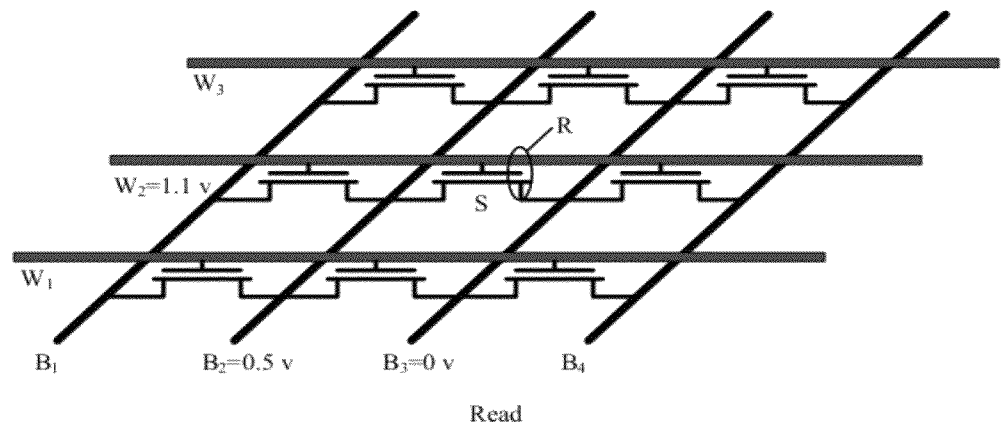
FIG. 7 is a circuit diagram illustrating reading of a selected cell according to a preferred embodiment of the present invention.

Turning to FIG. 7, to read cell S, word line W2 is set slightly above threshold voltage, for example at 1.1 volts. Cell S is preferably read by reversing source and drain from when the cell was programmed; now bit line B3 is the source line and bit line B2 is the drain line. B2 is preferably set at about 0.5 volts, while B3 is set at about zero volts. The device is turned on, and is not in saturation. If no charge has been stored in charge storage region R by a prior programming operation, a channel region will form at the source end (toward source line B3) and current will flow through device S.

If charge is stored in charge storage region R, however, the stored charge prevents the conductive channel from forming, and cell S will not conduct. In this manner a cell having charge stored in charge storage region R can be distinguished from one that does not.

Figure 8:
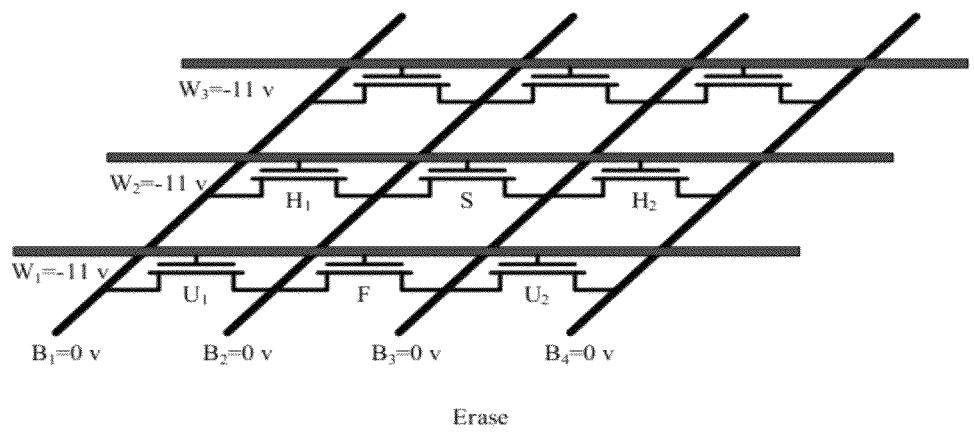
FIG. 8 is a circuit diagram illustrating erasure of a block of cells according to a preferred embodiment of the present invention.

It is usual in nonvolatile rewriteable memory arrays to erase a block of cells at a time, rather than selectively erasing a single cell. Turning to FIG. 8, to erase a block of memory cells (to remove any stored charge from the charge storage regions of these cells), negative voltage is applied to word lines W1, W2, and W3, for example about −11 volts. All bit lines (B1, B2, B3, and B4) are set low, for example at 0 volts. Stored electrons tunnel through the channel blocking dielectric to the channel region.

An alternative erase mechanism may be preferred. Word lines W1, W2, and W3 can be formed of heavily doped P-type polysilicon rather than heavily doped N-type silicon. In this case to erase a block of memory cells, all bit lines (B1-B4) are set to 0 volts, while word lines are set first to 2.5 volts to discharge the channels, then to −11 volts. In this case holes will tunnel through the gate blocking dielectric into the charge storage dielectric, annihilating electrons. It may be preferred for the gate blocking dielectric to be thinner, for example between about 10 and about 60 angstroms thick, preferably between about 30 and about 50 angstroms thick, to facilitate tunneling.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Detailed methods of fabrication have been described herein, but any other methods that form the same structures can be used while the results fall within the scope of the invention. While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The various embodiments are contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated. The foregoing detailed description has described only a few of the many forms that this invention can take. For this reason, this detailed description is intended by way of illustration, and not by way of limitation. Variations and modifications of the embodiments disclosed herein may be made based on the description set forth herein, without departing from the scope and spirit of the invention. It is only the following claims, including all equivalents, which are intended to define the scope of this invention. Moreover, the embodiments described above are specifically contemplated to be used alone as well as in various combinations. Accordingly, other embodiments, variations, and improvements not described herein are not necessarily excluded from the scope of the invention.

The invention claimed is:

1. A method for forming a monolithic three dimensional memory array, the method comprising:
   forming a first plurality of substantially parallel, substantially coplanar rail-shaped dielectric features extending in a first direction;
   conformally depositing a first semiconductor layer over the first rail-shaped dielectric features, wherein the deposited first semiconductor layer has a corrugated shape;
   conformally forming a first charge storage stack over the first semiconductor layer;
   forming a first plurality of substantially parallel, substantially coplanar word lines over the first charge storage stack, the wordlines extending in a second direction different from the first direction.

2. The method of claim 1, wherein the step of forming the first rail-shaped dielectric features comprises:
   forming a substantially planar surface coexposing alternating stripes of a first dielectric material and a first conductive material, wherein the first dielectric material is formed over and between rails of the first conductive material; and
   etching to recess the first conductive material, leaving the rail-shaped dielectric features.

3. The method of claim 2, wherein the rail-shaped dielectric features have sloping sidewalls.

4. The method of claim 2, wherein the step of forming the substantially planar surface comprises:
   depositing the first conductive material;
   patterning and etching the first conductive material to form first conductive rails;
   depositing the first dielectric material over and between the first conductive rails; and
   planarizing to expose tops of the first conductive rails.

5. The method of claim 2, wherein the first conductive material is heavily doped silicon.

6. The method of claim 5, wherein dopant diffuses from the heavily doped silicon into the first semiconductor layer, forming source/drain regions.

7. The method of claim 6, wherein the first conductive rails serve as bit lines.

8. The method of claim 1, wherein the first semiconductor layer is germanium or a germanium alloy.

9. The method of claim 1, wherein the step of depositing a first charge storage stack comprises:
   forming a first channel blocking dielectric on the first semiconductor layer;
   depositing a first charge storage dielectric on the first channel blocking dielectric; and
   depositing a first gate blocking dielectric on the first charge storage dielectric.

10. The method of claim 1, wherein the step of forming the first wordlines comprises:
    depositing a second conductive material over the charge storage stack; and
    patterning and etching the second conductive material to form the first word lines.

11. The method of claim 1, further comprising forming an interlevel dielectric above the first wordlines.

12. The method of claim 11, further comprising forming a second plurality of substantially parallel, substantially coplanar rail-shaped dielectric features above the first word lines.

13. The method of claim 12, further comprising conformally depositing a second semiconductor layer over the second rail-shaped dielectric features.

* * * * *